(12) United States Patent
Leary et al.

(10) Patent No.: US 11,610,738 B2
(45) Date of Patent: Mar. 21, 2023

(54) LOW PROFILE PASSIVE COMPONENTS AND DEVICES AND PACKAGES INCLUDING THE SAME

(71) Applicant: Avago Technologies International Sales Pte. Limited, Singapore (SG)

(72) Inventors: Michael Howard Leary, Sunnyvale, CA (US); Chris Chung, Seoul (KR); Ah Ron Lee, Seoul (KR)

(73) Assignee: Avago Technologies International Sales Pte, Limited, Singapore (SG)

( * ) Notice: Subject to any disclaimer, the term of this patent is extended or adjusted under 35 U.S.C. 154(b) by 60 days.

(21) Appl. No.: 16/588,419

(22) Filed: Sep. 30, 2019

(65) Prior Publication Data

US 2021/0098192 A1  Apr. 1, 2021

(51) Int. Cl.
| | |
|---|---|
| *H01G 4/248* | (2006.01) |
| *H01G 4/232* | (2006.01) |
| *H01G 4/012* | (2006.01) |
| *H01G 4/30* | (2006.01) |
| *H01L 25/16* | (2006.01) |
| *H01L 23/498* | (2006.01) |
| *H01L 23/538* | (2006.01) |
| *H01G 4/12* | (2006.01) |
| *H01G 4/242* | (2006.01) |
| *H01L 23/31* | (2006.01) |

(52) U.S. Cl.
CPC .............. *H01G 4/248* (2013.01); *H01G 4/012* (2013.01); *H01G 4/1227* (2013.01); *H01G 4/232* (2013.01); *H01G 4/242* (2013.01); *H01G 4/30* (2013.01); *H01L 23/49816* (2013.01); *H01L 23/538* (2013.01); *H01L 25/16* (2013.01); *H01L 23/3128* (2013.01)

(58) Field of Classification Search
CPC ...... H01G 4/224; H01G 4/012; H01G 4/2325; H01G 4/248; H01G 4/30; H01G 4/1227; H01G 4/008; H01G 4/0085; H01G 4/12; H01G 4/1236
See application file for complete search history.

(56) References Cited

U.S. PATENT DOCUMENTS

| | | | |
|---|---|---|---|
| 8,390,983 B2 | 3/2013 | Jeong et al. | |
| 2014/0166351 A1* | 6/2014 | Lee ..................... | H05K 3/3442 174/258 |
| 2014/0168849 A1* | 6/2014 | Lee ......................... | H01G 4/12 361/301.4 |
| 2015/0047887 A1* | 2/2015 | Lee ........................ | H05K 1/111 174/260 |
| 2017/0278634 A1* | 9/2017 | Kato ..................... | H01G 4/0085 |
| 2017/0367187 A1* | 12/2017 | Chae ....................... | H01G 4/30 |
| 2018/0218840 A1* | 8/2018 | Watabe .................. | H01G 4/248 |

(Continued)

OTHER PUBLICATIONS muRata "3D Silicon Capacitors", 16 pages.

*Primary Examiner* — Michael P McFadden
(74) *Attorney, Agent, or Firm* — Foley & Lardner LLP

(57) ABSTRACT

A passive component includes a body including a dummy portion and a device portion. The dummy portion and the device portion extend in a first direction and are arranged such that a longitudinal axis of the device portion is offset from a longitudinal axis of the body in a second direction perpendicular to the first direction. The passive component further includes first and second electrical contacts on at least one surface of the body.

20 Claims, 8 Drawing Sheets

(56) References Cited

U.S. PATENT DOCUMENTS

| | | |
|---|---|---|
| 2019/0080843 A1* | 3/2019 | Jang .................. H01G 4/30 |
| 2019/0141825 A1 | 5/2019 | Cho et al. |
| 2019/0287720 A1* | 9/2019 | Mori .................. H01G 4/232 |
| 2020/0118760 A1* | 4/2020 | Jun .................... H01G 4/30 |

* cited by examiner

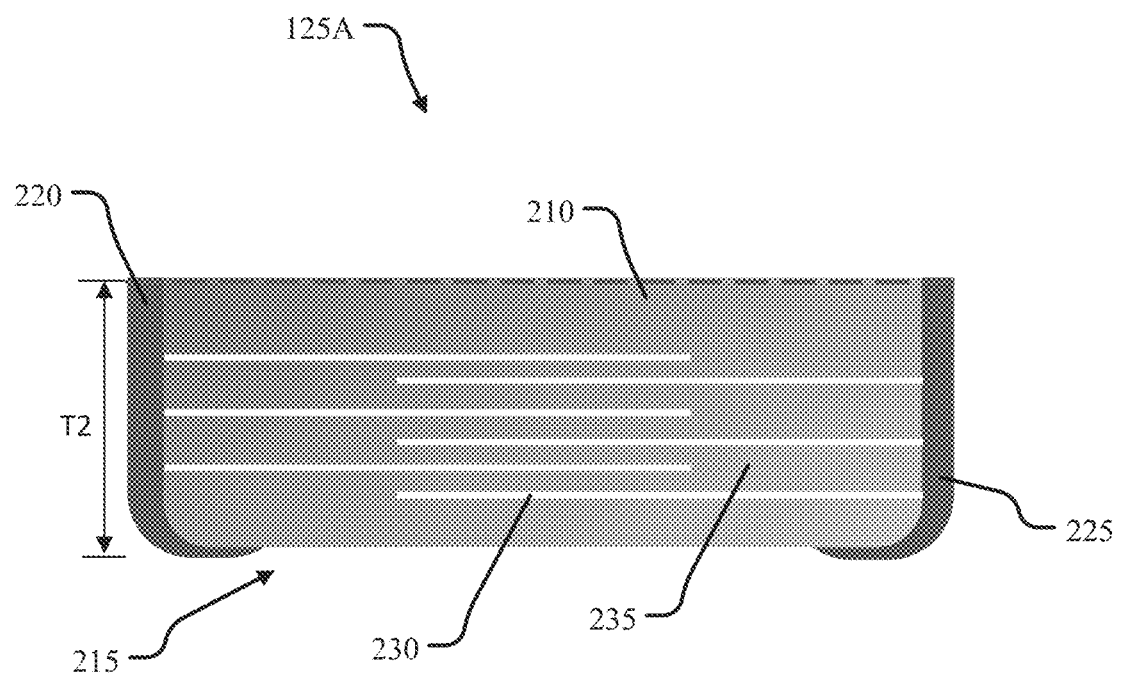
Fig. 2C
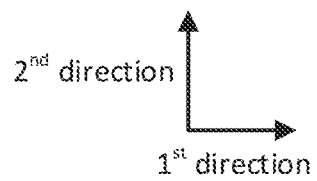

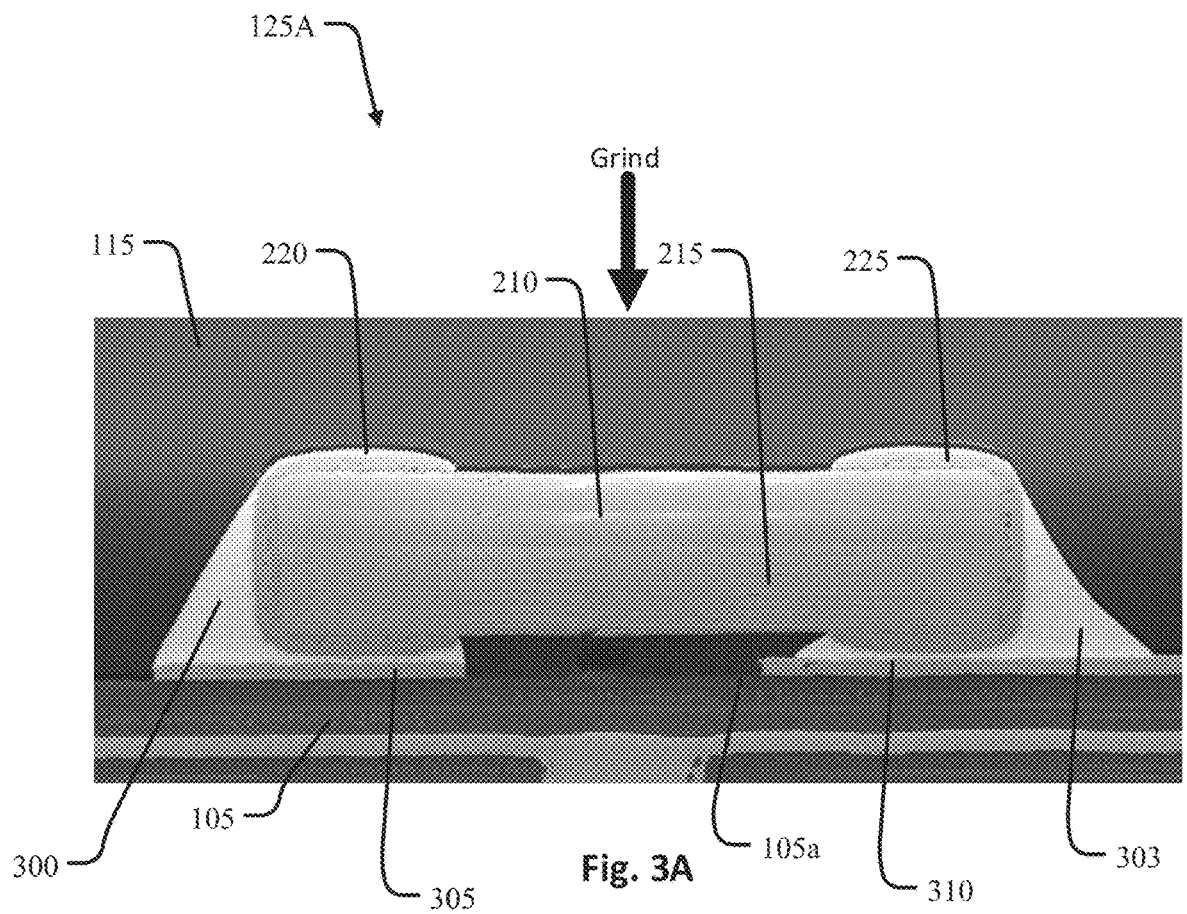
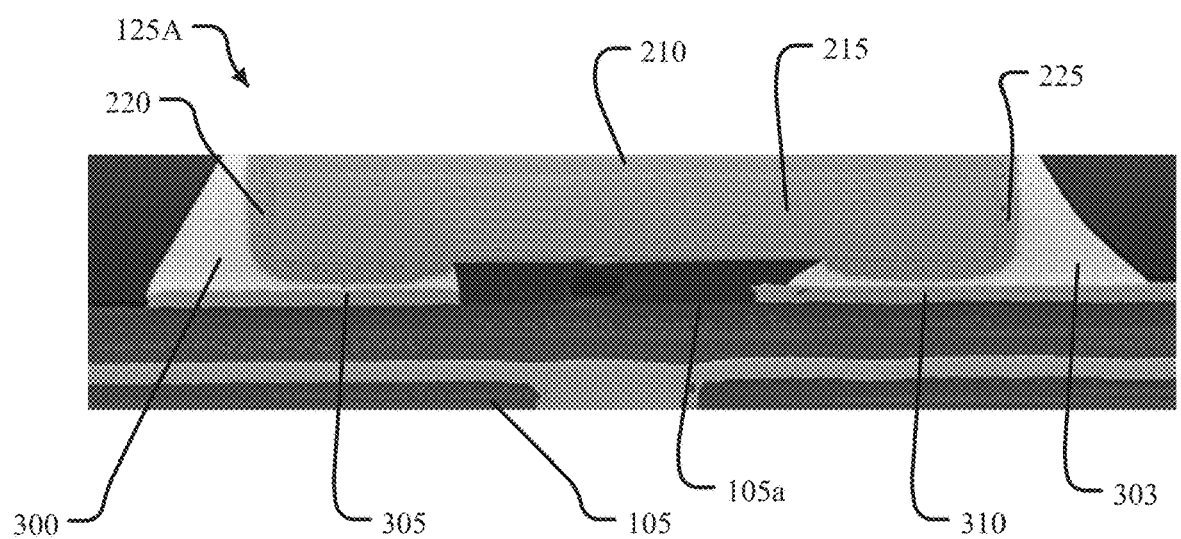
Fig. 3B
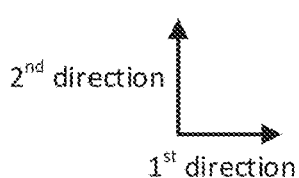

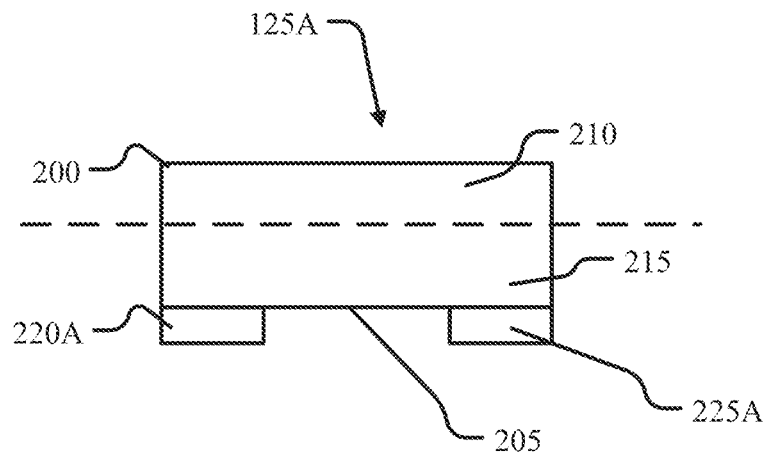
Fig. 4A
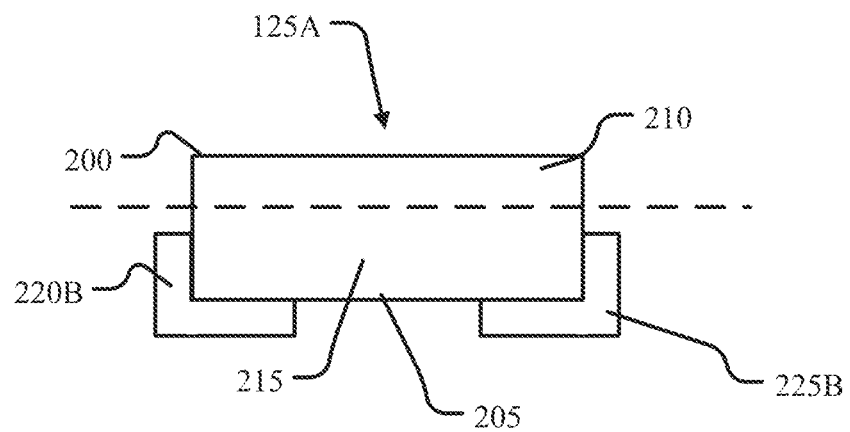
Fig. 4B
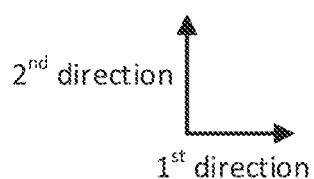

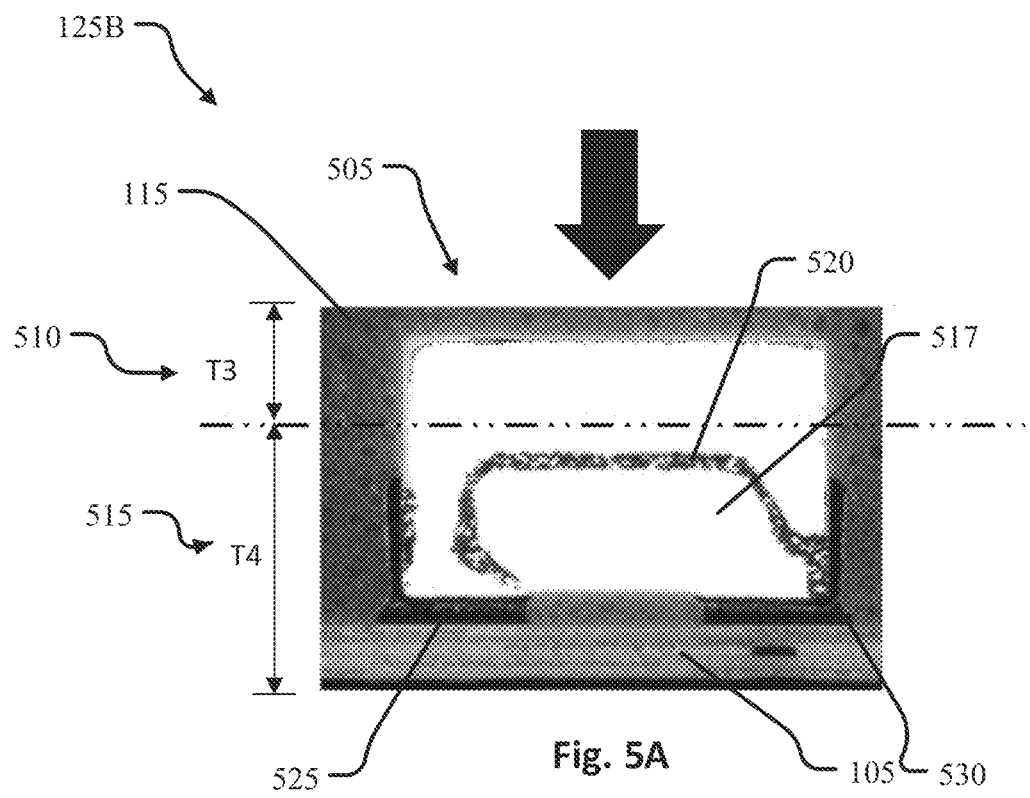
Fig. 5A
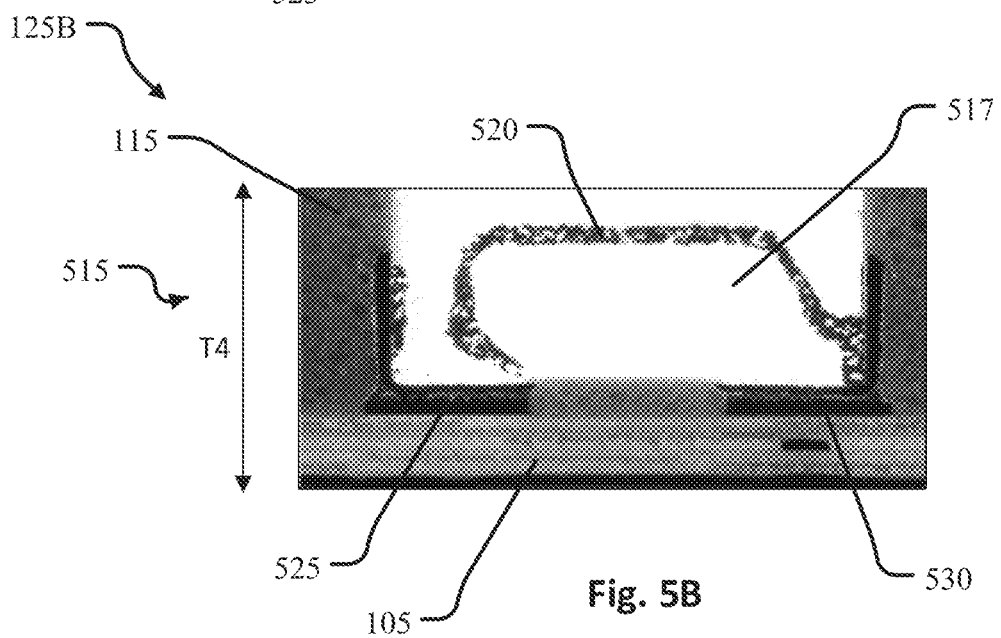
Fig. 5B
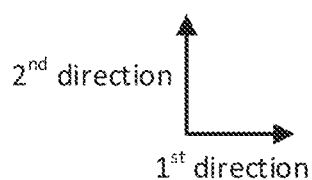

LOW PROFILE PASSIVE COMPONENTS AND DEVICES AND PACKAGES INCLUDING THE SAME

FIELD OF THE DISCLOSURE

Example embodiments are generally directed toward low profile passive components and devices and packages including the same.

BACKGROUND

Semiconductor packages with electronic components are common for operating compact consumer devices such as mobile phones, personal computer, tablets, etc. Some devices utilize double-sided semiconductor packaging, which may include printed circuit board (PCB) or other support structure with electronic components attached to both sides of the board or structure. These components may include active components such as transistors within integrated circuits (ICs) and/or passive components such as resistors, inductors, and/or capacitors.

BRIEF DESCRIPTION OF THE DRAWINGS

Inventive concepts are described in conjunction with the appended figures, which are not necessarily drawn to scale:

FIG. 2C is a cross-sectional view of the passive component in FIG. 2A taken along line II-II after thickness reduction in accordance with at least one example embodiment;

FIG. 3A is a cross-sectional view of a passive component in accordance with at least one example embodiment;

FIG. 3B is a cross-sectional view of the passive component in FIG. 3A after thickness reduction in accordance with at least one example embodiment;

FIG. 4A illustrates a simplified cross-sectional view of the passive component in FIG. 2A with a contact arrangement in accordance with at least one example embodiment;

FIG. 4B illustrates a simplified cross-sectional view of the passive component in FIG. 2A with a contact arrangement in accordance with at least one example embodiment; and FIG. 5A illustrates a cross sectional view of a passive component according to at least one example embodiment;

FIG. 5B illustrates a cross sectional view of the passive component in FIG. 5A after thickness reduction in accordance with at least one example embodiment;

DETAILED DESCRIPTION

Figure 1:
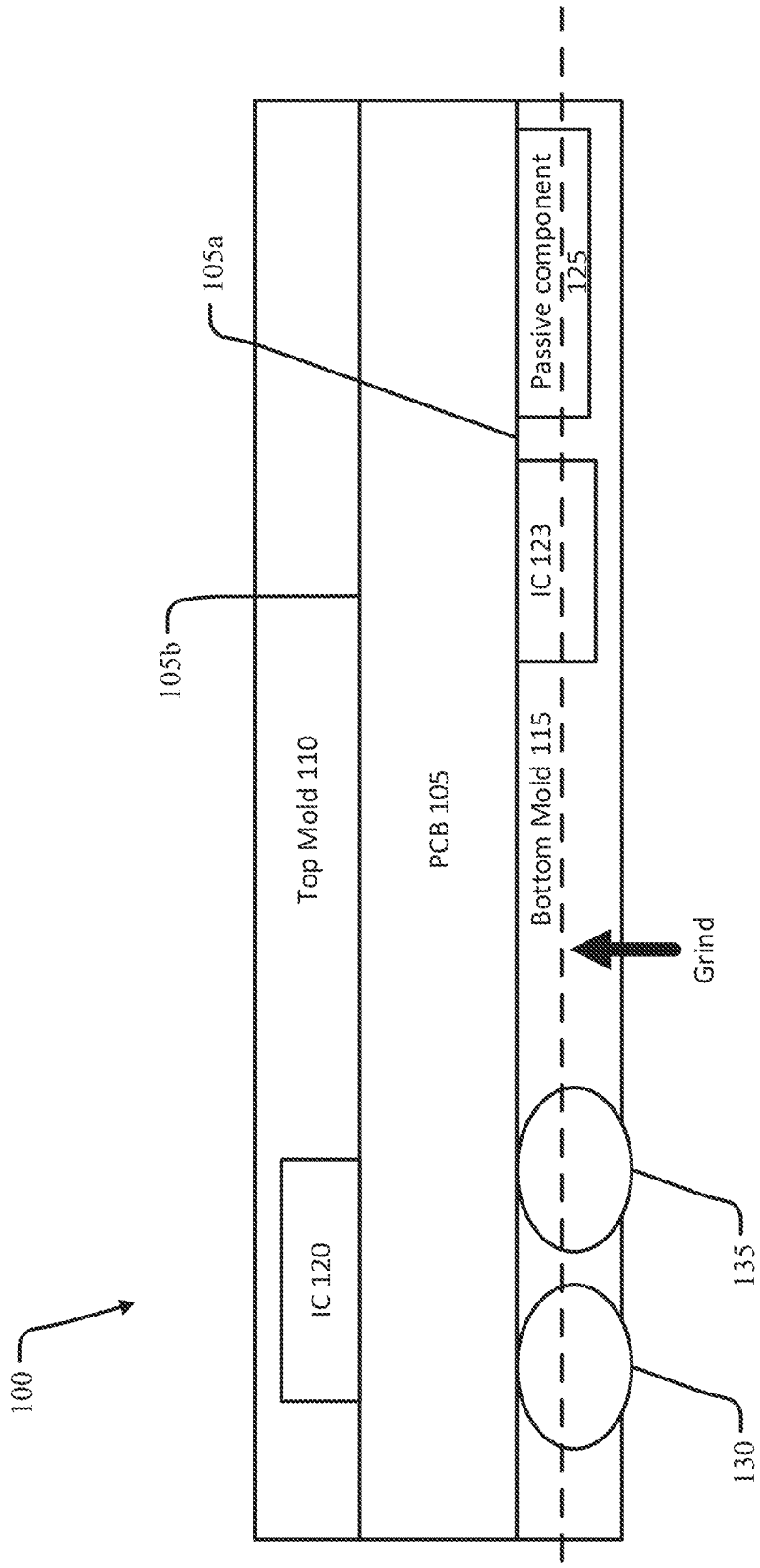
FIG. 1 is a block diagram depicting a semiconductor package in accordance with at least one example embodiment.

As the semiconductor industry develops, the feature size continues to become smaller to allow for more components to fit in a desired footprint. Mobile devices, such as smartphones, may include one or more semiconductor packages for controlling various functions. Some semiconductor packages may be double sided, meaning that there are electronic components attached to both sides of a PCB or other support substrate. These electronic components may include one or more passive components, such as resistors, capacitors, and/or inductors. As the industry continues to reduce the footprint of such components, problems may be encountered. For example, the manufacture and/or distribution of ultra thin or ultra low profile passive components may experience issues related to manufacturing limitations, transportation limitations, etc. For example, ultra thin passive components (e.g., capacitors with thicknesses under 65 microns) are susceptible to cracking and chipping during and after production. In addition, ultra thin components may experience problems during packaging, such as tape and reel difficulty, etc.

At least one example embodiment proposes a passive component that eliminates or reduces issues that may plague ultra thin passive components by introducing a passive component with an asymmetric structure, which controls the orientation of the device portion of the component relative to a dummy portion. In other words, the passive component may be formed such that the capacitive, resistive, and/or inductive element(s) within the passive component are protected by a dummy portion of the component. The dummy portion may be subjected to a removal process (e.g., a grinding process) post-assembly (e.g., after attachment of the passive component to the semiconductor package), where the dummy portion protects the capacitive, resistive, and/or inductive portion of the passive component.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

FIG. 1 is a block diagram depicting a semiconductor package 100 in accordance with at least one example embodiment.

As shown in FIG. 1, the semiconductor package (or package) 100 includes a support substrate, such as a PCB 105, a top mold (or material) 110, a bottom mold (or material) 115, one or more ICs 120/123, and a passive component 125. The PCB 105 includes a first surface 105a and a second surface 105b. As shown, the top mold 110 is disposed over the second surface 105b of the PCB 105 and the bottom mold 115 is disposed over the first surface 105a of the PCB 105. The semiconductor package 100 may further include one or more bumps (e.g., solder bumps) 130 and 135 for attaching the package 100 to a carrier substrate or other support substrate within a device, such as a mobile device. The bumps 130/135 are adjacent to the passive component 125 on the first surface 105a of the PCB 105. In the example of FIG. 1, an IC 123 is on the first surface 105a of the PCB 105 between the bump 135 and the passive component 125. In any event, the ICs 120/123 and/or the passive component 125 of semiconductor package 100 may function to control and/or assist with desired functions of the device in which package 100 is included.

The PCB 105 may include one or more conductive traces and/or vias for connecting elements of the PCB 105, such as the ICs 120/123, the passive component 125 and/or bumps (conductive bumps) 130/135, to one another. The conductive traces may be formed on surfaces of the PCB 105 and/or within the body of the PCB 105 as desired.

The top and bottom molds 110/115 may be passivation layers formed of a polymer or other protective layer that protect the components attached to the PCB 105. In at least one example embodiment, the top and/or bottom molds 110/115 may be removable (e.g., by grinding) in at least portions to reduce a thickness of the package 100. As shown in the example of FIG. 1, the bottom mold 115 may be subjected to a grinding or planarizing operation to reduce an overall thickness of the package 100. Thus, an ultra low profile passive component 125 that is able to withstand grinding and avoid cracking/chipping during manufacturing/transport is desirable, and is described in more detail below.

The ICs 120/123 may include one or more active components (e.g., transistors) to control functions of the device in which the package 100 is included. The ICs 120/123 may include one or more processing circuits (e.g., microprocessors), and one or more memories (e.g., volatile and/or nonvolatile memories) having instructions that are executed by the one or more processing circuits. Additionally or alternatively, the ICs 120/123 may include field programmable gate arrays (FPGAs), application specific integrated circuits (ASICs), and/or or any other hardware/software desired.

The passive component 125 may include a resistive, capacitive, and/or inductive component. FIGS. 2A-4B illustrate examples where the passive component 125 is a capacitor, for example, a multilayer ceramic capacitor (MLCC). In this case, the capacitor may serve as a shunt capacitor for the package 100 to reduce noise between components (e.g., ICs 120/123) of the package 100. However, inventive concepts also encompass other passive components, such as inductors and resistors.

Here, it should be understood that the ICs 120/123, passive component 125, and/or bumps 130/135 may be attached to the PCB 105 via known techniques, such as solder bonding (e.g., to conductive pads on the PCB 105), adhesion with polymers, or other known attachment techniques. In addition, the PCB 105 may include more or fewer elements attached thereto than shown in FIG. 1 depending on design preferences.

Figure 2A:
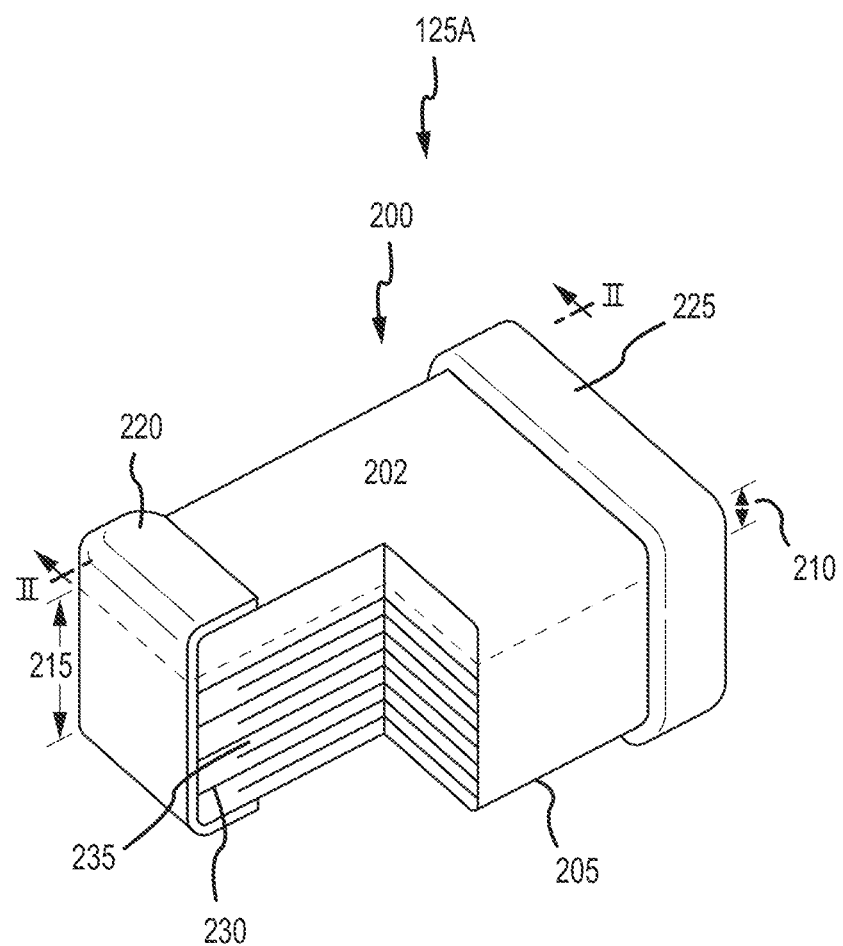
FIG. 2A is a perspective cutaway view of a passive component within the semiconductor package of FIG. 1 in accordance with at least one example embodiment.
Figure 2B:
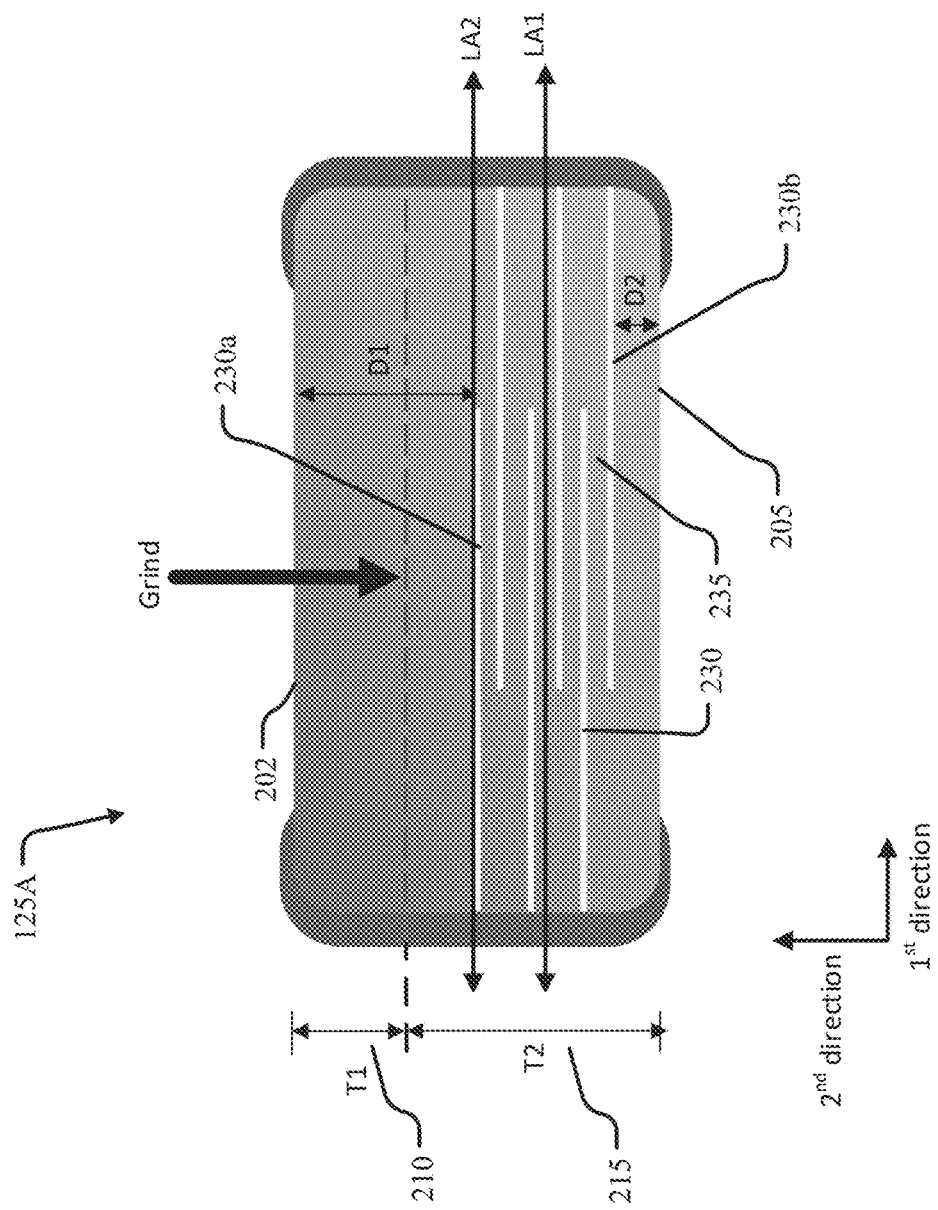
FIG. 2B is a cross-sectional view of the passive component in FIG. 2A taken along line II-II in accordance with at least one example embodiment.

FIG. 2A is a perspective cutaway view of a passive component 125A within the system of FIG. 1 in accordance with at least one example embodiment. FIG. 2B is a cross-sectional view of the passive component 125A in FIG. 2A taken along line II-II in accordance with at least one example embodiment. FIG. 2C is a cross-sectional view of the passive component 125A in FIG. 2A taken along line II-II after thickness reduction in accordance with at least one example embodiment. As noted above, FIGS. 2A-2C depict an example where the passive component 125A is a capacitor, for example, an MLCC.

With reference to FIGS. 2A-2C, the passive component 125A includes a body 200. The body 200 may be an elongated body 200 including having a first surface 202 and a second surface 205 opposite the first surface 202. The body 200 may include a dummy portion 210 and a device portion 215. The dummy portion 210 and the device portion 215 extend in a first direction and are arranged such that a longitudinal axis LA1 of the device portion 215 is offset from a longitudinal axis LA2 of the body 200 in a second direction perpendicular to the first direction. Here, it should be understood that the longitudinal axis LA1 is a centerline of the device portion 215 along the first direction in a side view, and the longitudinal axis LA2 is a centerline of the body 200 along the first direction in the side view. By way of an example with reference to FIGS. 1 and 2A-2C, the first direction is parallel to the first surface 105a of the PCB 105 of which the passive component 125A is attached thereto while the second direction is perpendicular to the first surface 105a of the PCB 105. It is noted that the second direction may be different from the embodiment shown in FIG. 1 or FIGS. 2A-2C depending on the direction of grinding. The dummy portion 210 is offset towards the bottom surface of the passive component 125A. In an end product after a grinding process, the dummy portion 210 may have a surface that is substantially on the same plane as a bottom surface of the solder material 130 and 135 and/or a bottom surface of the IC 123. In at least one example embodiment, the IC 123 and/or the solder material 130/135 may be thin enough so that, after removal of the bottom mold 115, surfaces of the solder material 130/135 and/or the IC 123 are not exposed. For example, prior to removal of the bottom mold 115, the passive component 125A may have a thickness that equal to or greater than a thickness of the IC 123. However, example embodiments are not limited thereto, and the passive component 125A may be thinner than the IC 123 before the grinding process. In at least one example embodiment, the IC 123 may also have a dummy portion that may be removed during the grinding process of bottom mold 115. In at least one other example embodiment, the solder material 130/135 is formed after a portion of the bottom mold 115 has been removed.

The body 200 may include an insulation material, such as a ceramic material or other suitable insulator. For example, the body 200, including the dummy portion 210 and the device portion 215, may comprise $BaTiO_3$ having a breakdown voltage of about 5V to about 10V. That is, the dummy portion 210 and the device portion 215 may be unitary/integrally formed. Other materials and breakdown voltages may be employed according to design preferences.

The passive component 125A may include first and second electrical contacts (or contacts) 220/225 on at least one surface of the body 200 (e.g., unlabeled side surfaces and/or surfaces 202/205). The electrical contacts 220/225 may include a metal or other suitable conductor. For example, the first contact 220 is at a first end of the body 200, and the second contact 225 is at a second end of the body 200 opposite the first end. The contacts 220/225 may serve as the point of electrical contact to a contact pad on PCB 105. As shown, the contacts 220/225 may extend a same distance over the surfaces 202/205 toward a center of the body 200.

As shown in FIGS. 2A to 2C, the first and second electrical contacts 220/225 may be in direct electrical contact with the device portion 215. For example, in accordance with an MLCC structure, a plurality of electrode layers (or plurality of conductive layers, or plurality of conductive plates) 230 reside within the device portion 215, and the first electrical contact 220 contacts (e.g., directly contacts) first ones of the plurality of electrode layers 230 and the second electrical contact 225 contacts (e.g., directly contacts) second ones of the plurality of electrode layers 230 (see, e.g., FIG. 2B which shows some electrode layers 230 connected to contact 220 and other electrode layers 230 connected to contact 225). Here, it should be understood that a number and/or density of the electrode layers 230 may determine a final capacitance value of the passive component 125A, where the final capacitance value is a design parameter set based on empirical evidence and/or preference. Thus, the number and/or density may also be design parameters set based on empirical evidence and/or preference. The electrode layers 230 may be formed within the device portion 215 according to known techniques for manufacturing MLCCs.

As noted above, a longitudinal axis LA1 and a longitudinal axis LA2 may be offset from one another in the second direction. Said another way and with reference to FIG. 2B, a plurality of conductive layers 230 are disposed in the body 200 and extend in a same direction as a longitudinal axis LA1 of the body 200. The plurality of conductive layers 230 include a first conductive layer 230a closest to the first surface 202 and a second conductive layer 230b closest to the second surface 205. A first distance D1 between the first surface 202 and the first conductive layer 230a is greater than a second distance D2 between the second surface 205 and the second conductive layer 230b. This allows the first surface 202 to be subjected to a grinding or planarizing operation to reduce the thickness of the passive component 125A to that shown in FIG. 2C. As shown, the plurality of conductive layers 230 include a first set of conductive layers 230 in contact with the first contact 220, and a second set of conductive layers 230 in contact with the second contact 225. As also shown, the first set of conductive layers and the second set of conductive layers are interdigitated.

The position of the device portion 215 may be described in yet another way, where the passive component 125A includes a surface 205 facing a surface of the support substrate or PCB 105, and the device portion 215 is disposed in the body 200 such that the passive component 125A is asymmetrical along a longitudinal axis LA2 of the body 200.

As further shown in FIGS. 2A-2C, the device portion 215 includes an insulation material 235 that occupies spaces between the plurality of electrode layers 230. The insulation material 235 may be a ceramic material (comprising $BaTiO_3$) or other insulator. The entire body 200, including both the device portion 215 and the dummy portion 210, may be formed of the insulation material 235.

As shown in FIG. 2B, the dummy portion 210 has a dummy portion thickness T1 measured in the second direction perpendicular to the first direction, and the device portion 215 has a device portion thickness T2 measured in the second direction. In at least one example embodiment, the device portion thickness T2 is thicker than the dummy portion thickness T1. For example, the device portion thickness T2 is less than two times thicker than the dummy portion thickness T1 before grinding. In at least one example, the combined thickness of T1 and T2 (i.e., a thickness of the body 200) is about 100 microns to about 110 microns. In this case, the thickness T2 is less than about 65 microns, and the thickness T1 is about 35-45 microns. Here, the thickness T2 of less than about 65 microns may be considered an ultra low profile component. However, example embodiments are not limited thereto and the thicknesses may vary if desired.

FIGS. 2A and 2B illustrate examples where the contacts 220/225 have bracket ('["]') shapes. However, example embodiments are not limited thereto, and FIG. 4 illustrates additional example shapes for the contacts 220/225.

As alluded to above, the passive component 125A in FIGS. 2A and 2B may be subjected to a grinding or planarizing operation that results in the final structure shown in FIG. 2C, where some or all of the dummy portion 210 is removed from the body 200 so that the device portion 215 remains. Post grinding, the device portion thickness T2 may be more than two times thicker than the dummy portion thickness T1. For example, after grinding, the dummy portion 210 may have a thickness that is about 10% of a thickness of the device portion 215. In this case, the bracket shaped contacts 220/225 from FIGS. 2A and 2B have also been ground such that L-shaped contacts 220/225 remain. In addition, it should be appreciated that subsequent to grinding, the dummy portion 210 has a surface that is coplanar with a surface of the bottom mold 115.

FIG. 3A is a cross-sectional view of the passive component 125A in FIG. 1 in accordance with at least one example embodiment. FIG. 3B is a cross-sectional view of the passive component 125A in FIG. 3A after thickness reduction in accordance with at least one example embodiment.

FIGS. 3A and 3B represent the same structure as in FIGS. 2A-2C, except that FIGS. 3A and 3B illustrate camera/microscope views of the passive component 125A. Accordingly, a description of like numbered elements in FIGS. 3A and 3B will not be repeated for the sake of brevity.

As shown in FIGS. 3A and 3B, the PCB 105 may include contact pads 305/310 to which the contacts 220/225 are connected via electrical connections 300/303. The electrical connections 300/303 may comprise solder or other conductive material (e.g., conductive paste) for adhering the contacts 220/225 to the contact pads 305/310. Here, it should be appreciated that FIG. 3B illustrates the passive component 125A post-grinding, where little to no dummy portion 210 remains so that a low profile passive component 125A is formed with the device portion 215 avoid damage by the grinding process due to the asymmetric structure of the passive component 215. In addition, the grinding process may expose topmost surfaces of the contacts 220/225 within the bottom mold 115.

Here, it should be appreciated that FIGS. 3A and 3B illustrate that the grinding process may occur after the passive component 125A is mounted to the PCB 105, thereby avoiding problems (e.g., cracking/chipping) associated with manufacturing and/or transporting a component that was initially formed to be at the thickness of the passive component according to at least one example embodiment. The asymmetric formation of the device portion 215 within the body 200 avoids damage to the device portion 215 (e.g., damage to the electrode layers 230) while achieving a lower profile than is possible with the related art. Thus, a method for manufacturing the package 100 may include mounting the passive component 125A (and other components) to the PCB 105, forming the top and bottom molds 110/115 over surfaces of the PCB 105 and the passive component 125A and the other components, and then grinding or planarizing the bottom mold 115 until the passive component 125A and/or the bottom mold 115 is at a desired thickness.

FIG. 4A illustrates a simplified cross-sectional view of the passive component 125A in FIG. 2A with a contact arrangement according to at least one example embodiment. As shown in FIG. 4A, the first and second electrical contacts 220A/225A may comprise planar contacts formed on a surface 205 of the body 200 to make contact with respective contact pads on the PCB 105. In FIG. 4A, it should be understood that the electrodes 230 in the device portion 215 may have a common electrical connection to one of the pads 220A/225B so that the electrodes 230 have a same electrical configuration as shown in FIGS. 2A-2C. For example, conductive lines extending in the second direction may be formed within the body 200 at each end of the body 200 to achieve the same effect as the contacts 220/225 in FIGS. 2A-2C.

FIG. 4B illustrates a simplified cross-sectional view of the passive component in FIG. 2A with a contact arrangement according to at least one example embodiment. As shown in FIG. 4B, the first and second electrical contacts 220B/225B comprise L-shaped metal structures on opposing ends of the body 200 to make contact with respective contact pads on the PCB 105. In at least one example embodiment, the L-shaped metal structures do not contact the dummy portion 210. However, the L-shaped metal structures may contact the dummy portion 210 if desired.

FIG. 5A illustrates a cross sectional view of a passive component 125B according to at least one example embodiment. FIG. 5B illustrates a cross sectional view of the passive component 125B in FIG. 5A post grinding or removal process. The passive component 125B may be an inductor with a desired inductance.

As shown, the passive component 125B includes a body 505 having a dummy portion 510 and a device portion 515. The dummy portion 510 and the device portion 515 may include a core material 517. The device portion 515 may include a conductor 520 coiled within the core material 517. The conductor 510 may have one end electrically connected to a contact 525 and another end electrically connected to a contact 530. A middle portion of the conductor 510 may include a desired number of windings coiled within the core material 517. The conductor 520 may include a metal, such as copper or other suitable conductor for inductors, while the core material 517 may include a ferromagnetic material such as iron or ferrite or other suitable core material for inductors. The contacts 525/530 may comprise a conductor, for example, a metal such as nickel, copper, tin, etc.

The passive component 125B may be adhered to the first surface 105a of the PCB 105 via the contacts 525/530 and/or via an adhesive material.

A thickness T3 of the dummy portion 510 may be about 80 microns while a thickness T4 of the device portion 515 may be about 170 microns. As shown in FIG. 5B, the dummy portion 510 may be removed (e.g., grinded) so that the device portion 515 remains. Here, it should be understood that at least some of the dummy portion 510 or some core material 517 in the device portion 515 may be left intact so that the conductor 520 is not damaged. Thus, post-removal, a surface of the dummy portion 510 or a surface of the device portion 515 may be exposed within the bottom mold 115.

It should be appreciated that the contacts 525/530 are not limited to the structure shown in FIGS. 5A and 5B, and may include any of the contact structures described herein.

Figures 6A, 6B:
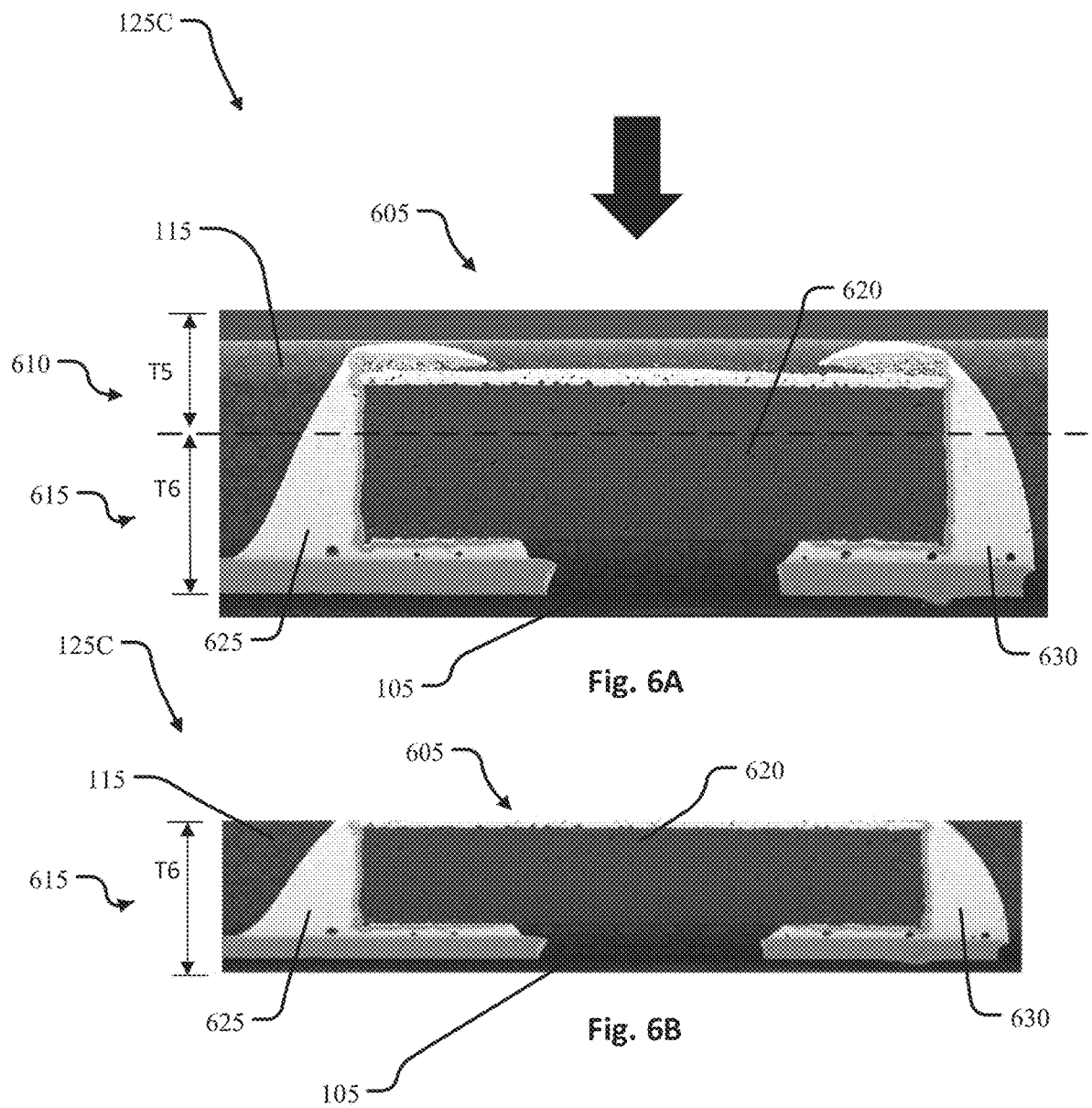
FIG. 6A illustrates a cross sectional view of a passive component in accordance with at least one example embodiment.
FIG. 6B illustrates a cross sectional view of the passive component in FIG. 6A after thickness reduction in accordance with at least one example embodiment.

FIG. 6A illustrates a cross sectional view of a passive component 125C according to at least one example embodiment. FIG. 6B illustrates a cross sectional view of the passive component 125C in FIG. 6A post grinding or removal process. The passive component 125C may be resistor with a desired resistance.

As shown, the passive component 125C includes a body 605 having a dummy portion 610 and a device portion 615. The dummy portion 610 and the device portion 615 may include a material 620 having the desired resistance. The material 620 may have one end electrically connected to a contact 625 and another end electrically connected to a contact 630. The material 620 may include a material used for making resistors, such as carbon, metal, metal oxide, etc. The contacts 625/630 may comprise a conductor, for example, a metal such as nickel, copper, tin, etc.

When the dummy portion 610 is made of the same material as the device portion 615, an amount of grinding applied to the dummy portion 610 may change the overall resistance value of the passive component 125C. In this case, the amount of material 620 removed from the dummy portion 610 may be controlled to achieve a desired resistance value of the resulting passive component 125C. However, inventive concepts are not limited thereto and according to at least one example embodiment, the dummy portion 610 is made of a different material than device portion 615 so that grinding the dummy portion 610 does not significantly affect the overall resistance of the passive component 125C. For example, the dummy portion 610 may comprise an insulator, such as silicon oxide, a polymer, or other suitable material that has little or no affect on the overall resistance of the passive component 125C after removal of the dummy portion 610.

The passive component 125C may be adhered to the first surface 105a of the PCB 105 via the contacts 625/630 and/or via an adhesive material.

A thickness T5 of the dummy portion 610 may be about 45 microns while a thickness T6 of the device portion 615 may be about 65 microns. As shown in FIG. 6B, the dummy portion 610 may be removed (e.g., grinded) so that the device portion 615 remains. Here, it should be understood that at least some of the dummy portion 610 or some material 620 in the device portion 615 may be left intact. Thus, post-removal, a surface of the dummy portion 610 or a surface of the device portion 615 may be exposed within the bottom mold 115. In addition, surfaces of contacts 625/630 may also be exposed within the bottom mold 115.

It should be appreciated that the contacts 625/630 are not limited to the structure shown in FIGS. 6A and 6B, and may include any of the contact structures described herein.

It should further be appreciated that all inventive concepts for passive component 125A described with reference to FIGS. 2A-3B may also be applied to the passive components 125B and 125C described with reference to FIGS. 5A-6B. For example, the dummy portions 510/610 and the device portions 515/615 extend in a first direction and are arranged such that a longitudinal axis of each device portion 515/615 is offset from a longitudinal axis of each body 505/605 in a second direction perpendicular to the first direction. As another example, the above described relationships between the passive component 125A and other components on the PCB 105 (e.g., the ICs 120/123, the bottom mold 115, and the bumps 130/135) may also apply to the passive components 125B and 125C. That is, anything described and/or shown for passive component 125A may also apply to passive components 125B and 125C, however, a description thereof is not repeated for passive components 125B and 125C.

In view of the above, it should be appreciated that at least one example embodiment provides a package 100 including a support substrate 105 having a first surface and a second surface opposite the first surface. A passive component 125 may be attached to the first surface. In accordance with at least one example embodiment, the passive component 125 may include a body 200 including a first surface 205 facing the first surface of the support substrate 105. The passive component 125 may include a device portion 215 disposed in the body 200 such that the passive component 125 is asymmetrical along a longitudinal axis of the body 200. Further, first and second electrical contacts 220/225 are on the body 200. The package 100 may include a first material 115 covering the first surface of the support substrate 105 and the passive component 125.

The first material 115 may cover the passive component 125 such that a part of the dummy portion 210 and parts of the first and second electrical contacts 220/225 are exposed.

IN addition, the package 100 may include a plurality of conductive plates 230 residing within the device portion 215. As noted above, the body 200 includes a ceramic material that occupies spaces between the plurality of conductive plates 230. Further, the first electrical contact contacts first ones of the plurality of conductive plates 230 and the second electrical contact contacts second ones of the plurality of conductive plates 230. The package 100 may include one or more integrated circuits 120/1423 attached to at least one of the first surface of the support substrate 105 and the second surface of the support substrate 105.

In view of the foregoing, it should be appreciated that at least one example embodiment provides a low profile passive component while avoiding the issues that plague the related art during manufacturing, transport, and/or assembly. In addition, although example embodiments have been described with respect the passive component being a capacitor, inventive concepts also cover other components such as resistors and/or inductors. In this case, a resistive and/or inductive element is formed with the same asymmetric structure for the device portion 215 as described above, where the device portion 215 includes the resistive and/or inductive structure and the dummy portion 210 is grinded down.

At least one example embodiment is directed to a passive component that includes a body including a dummy portion and a device portion. The dummy portion and the device portion extend in a first direction and are arranged such that a longitudinal axis of the device portion is offset from a longitudinal axis of the body in a second direction perpendicular to the first direction. The passive component further includes first and second electrical contacts on at least one surface of the body.

According to at least one example embodiment, the first and second electrical contacts are in direct electrical contact with the device portion.

According to at least one example embodiment, a plurality of electrode layers reside within the device portion.

According to at least one example embodiment, the device portion includes an insulation material that occupies spaces between the plurality of electrode layers.

According to at least one example embodiment, the first electrical contact contacts first ones of the plurality of electrode layers and the second electrical contact contacts second ones of the plurality of electrode layers.

According to at least one example embodiment, the dummy portion has a dummy portion thickness measured in a second direction perpendicular to the first direction, the device portion has a device portion thickness measured in the second direction, and the device portion thickness is thicker than the dummy portion thickness.

According to at least one example embodiment, the device portion thickness is less than two times thicker than the dummy portion thickness.

According to at least one example embodiment, the first and second electrical contacts comprise L-shaped metal structures on opposing ends of the body.

According to at least one example embodiment, the L-shaped metal structures do not contact the dummy portion.

According to at least one example embodiment, a capacitor includes an elongated body including a first surface and a second surface opposite the first surface, first and second contacts on the body, and a plurality of conductive layers disposed in the body and extending in a same direction as a longitudinal axis of the body. The plurality of conductive layers include a first conductive layer closest to the first surface and a second conductive layer closest to the second surface. A first distance between the first surface and the first conductive layer is greater than a second distance between the second surface and the second conductive layer.

According to at least one example embodiment, the plurality of conductive layers include a first set of conductive layers and a second set of conductive layers. The first set of conductive layers are contact with the first contact, and the second set of conductive layers are in contact with the second contact.

According to at least one example embodiment, the first set of conductive layers and the second set of conductive layers are interdigitated.

According to at least one example embodiment, the first contact is at a first end of the body, and the second contact is at a second end of the body opposite the first end.

According to at least one example embodiment, the body comprises a ceramic material.

According to at least one example embodiment, a package includes a support substrate having a first surface and a second surface opposite the first surface, and a passive component attached to the first surface of the support substrate. The passive component includes a body including a first surface facing the first surface of the support substrate, a device portion disposed in the body such that the passive component is asymmetrical along a longitudinal axis of the body, and first and second electrical contacts on the body. The package includes a first material covering the first surface of the support substrate and the passive component.

According to at least one example embodiment, the package includes at least one solder bump disposed on the first surface of the support substrate and adjacent to the passive component such that the at least one solder bump and the passive component are disposed on a same side of the support substrate.

According to at least one example embodiment, the passive component includes a dummy portion, and, subsequent to removal of the first material and the dummy portion, the dummy portion has a surface that is coplanar with a surface of the first material.

According to at least one example embodiment, the first material covers the passive component such that a part of the dummy portion and parts of the first and second electrical contacts are exposed.

According to at least one example embodiment, the package further includes a plurality of conductive plates residing within the device portion.

According to at least one example embodiment, the body includes a ceramic material that occupies spaces between the plurality of conductive plates.

According to at least one example embodiment, the first electrical contact contacts first ones of the plurality of conductive plates and the second electrical contact contacts second ones of the plurality of conductive plates.

According at least one example embodiment, the passive component is a resistor, an inductor, or a capacitor.

According to at least one example embodiment, the package further includes one or more integrated circuits attached to at least one of the first surface of the support substrate and the second surface of the support substrate. A thickness of the passive component is greater than or equal to a thickness of the one or more integrated circuits.

Specific details were given in the description to provide a thorough understanding of example embodiments. However, it will be understood by one of ordinary skill in the art that example embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. A capacitor, comprising:
    an elongated body including a first surface, a second surface opposite the first surface, and a dummy portion in contact with the first surface;
    first and second contacts on the body, wherein the first and second contacts on the body comprise L-shaped metal structures on opposing ends of the body, wherein the L-shaped metal structures do not contact the dummy portion; and
    a plurality of conductive layers disposed in the body and extending in a same direction as a longitudinal axis of the body, the plurality of conductive layers including a first conductive layer closest to the first surface and a second conductive layer closest to the second surface, wherein a first distance between the first surface and the first conductive layer is greater than a second distance between the second surface and the second conductive layer,
    wherein the body has a body thickness measured in a second direction perpendicular to the longitudinal axis of the body, the dummy portion has a dummy portion thickness measured in the second direction, and the dummy portion thickness is 10% or less than the body thickness.

2. The capacitor of claim 1, wherein the plurality of conductive layers include a first set of conductive layers and a second set of conductive layers, wherein the first set of conductive layers are in contact with the first contact, and wherein the second set of conductive layers are in contact with the second contact.

3. The capacitor of claim 2, wherein the first set of conductive layers and the second set of conductive layers are interdigitated.

4. The capacitor of claim 2, wherein an insulation material is disposed between the first set of conductive layers and the second set of conductive layers.

5. The capacitor of claim 1, wherein the body comprises a ceramic material.

6. The capacitor of claim 5, wherein the body comprises barium titanate ($BaTiO_3$).

7. The capacitor of claim 1, wherein the first surface and the second surface extend in the same direction as the plurality of conductive layers.

8. The capacitor of claim 1, wherein the L-shaped metal structures are disposed on the second surface.

9. A capacitor, comprising:
    a body including a dummy portion and a device portion, the dummy portion and the device portion extending in a first direction and arranged such that a longitudinal axis of the device portion is offset from a longitudinal axis of the body in a second direction perpendicular to the first direction; and
    first and second electrical contacts on at least one surface of a first surface and a second surface of the body, wherein the first and second electrical contacts comprise L-shaped metal structures on opposing ends of the body, wherein the L-shaped metal structures do not contact the dummy portion, wherein the device portion has a device portion thickness measured in the second direction, and the device portion thickness is less than 65 microns, wherein a first distance between the first surface and the first conductive layer is greater than a second distance between the second surface and the second conductive layer, wherein the body has a body thickness measured in a second direction perpendicular to the longitudinal axis of the body, the dummy portion has a dummy portion thickness measured in the second direction, and the dummy portion thickness is 10% or less than the body thickness.

10. The capacitor of claim 9, wherein the first and second electrical contacts are in direct electrical contact with the device portion.

11. The capacitor of claim 9, further comprising a plurality of electrode layers residing within the device portion.

12. The capacitor of claim 11, wherein the device portion includes an insulation material that occupies spaces between the plurality of electrode layers.

13. The capacitor of claim 11, wherein the first electrical contact contacts first ones of the plurality of electrode layers and the second electrical contact contacts second ones of the plurality of electrode layers.

14. The capacitor of claim 9, wherein:
the dummy portion has a dummy portion thickness measured in the second direction; and
the device portion thickness is thicker than the dummy portion thickness.

15. The capacitor of claim 14, wherein the device portion thickness is more than two times thicker than the dummy portion thickness.

16. A capacitor comprising:
a body comprising:
a first surface and a second surface opposite the first surface;
a device portion disposed in the body such that the device portion is asymmetrical along a longitudinal axis of the body;
a dummy portion in contact with the device portion; and
first and second electrical contacts on the body, wherein the first and second electrical contacts on the body comprise L-shaped metal structures on opposing ends of the body, wherein the L-shaped metal structures do not contact the dummy portion,
wherein the device portion has a device portion thickness measured in a direction perpendicular to the longitudinal axis, and the device portion thickness is less than 65 microns, wherein the body has a body thickness measured in the direction perpendicular to the longitudinal axis of the body, the dummy portion has a dummy portion thickness measured in the direction perpendicular to the longitudinal axis of the body, and the dummy portion thickness is 10% or less than the body thickness.

17. The capacitor of claim 16, wherein the body comprises a ceramic material.

18. The capacitor of claim 16, wherein the first surface and the second surface extend in a same direction as the longitudinal axis of the body.

19. The capacitor of claim 16, wherein the dummy portion is disposed on the first surface and the L-shaped metal structures are disposed on the second surface.

20. The capacitor of claim 16, wherein the body comprises barium titanate ($BaTiO_3$.

* * * * *